United States Patent
Sato et al.

(10) Patent No.: US 7,355,174 B2
(45) Date of Patent: Apr. 8, 2008

(54) CHARGED PARTICLE BEAM EMITTING DEVICE AND METHOD FOR ADJUSTING THE OPTICAL AXIS

(75) Inventors: Mitsugu Sato, Hitachinaka (JP); Makoto Ezumi, Mito (JP); Satoru Yamaguchi, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 222 days.

(21) Appl. No.: 11/166,370

(22) Filed: Jun. 27, 2005

(65) Prior Publication Data

US 2005/0285036 A1 Dec. 29, 2005

(30) Foreign Application Priority Data

Jun. 28, 2004 (JP) ............................. 2004-189442

(51) Int. Cl.
*G01N 23/00* (2006.01)

(52) U.S. Cl. ..................... 250/310; 250/306; 250/307

(58) Field of Classification Search ..................... None
See application file for complete search history.

(56) References Cited

U.S. PATENT DOCUMENTS 6,603,128 B2 * 8/2003 Maehara et al. ....... 250/441.11
6,614,026 B1 * 9/2003 Adamec ..................... 250/398
2005/0236570 A1 * 10/2005 Morokuma et al. ......... 250/311
2006/0060781 A1 * 3/2006 Watanabe et al. ........... 250/310

FOREIGN PATENT DOCUMENTS

| JP | 55-048610 | 3/1980 |
|---|---|---|
| JP | 02-033843 | 2/1990 |
| JP | 2003-348658 | 12/2000 |
| JP | 2001-015055 | 1/2001 |
| JP | 2001-283759 | 12/2001 |
| JP | 2002-352758 | 12/2002 |
| JP | 2003-022771 | 1/2003 |
| JP | 2004-127930 | 4/2004 |
| WO | WO 01/33603 A1 | 5/2001 |

* cited by examiner

*Primary Examiner*—Jack I. Berman
*Assistant Examiner*—Andrew Smyth
(74) *Attorney, Agent, or Firm*—McDermott Will & Emery LLP

(57) ABSTRACT

A charged-particle beam emitting device which includes the following configuration devices so that a lowering in the image resolution will be suppressed even if a primary beam is tilted relative to a sample: A device for causing orbit of the primary beam to pass through off-axes of a plurality of lenses, and controlling off-axis orbit of the primary beam. This device allows the aberration which occurs in the objective lens at the time of beam tilt to be cancelled out by the aberration which occurs in the other lens. Also, there is provided a device for simultaneously modulating excitations of the plurality of lenses including the objective lens.

8 Claims, 8 Drawing Sheets

CHARGED PARTICLE BEAM EMITTING DEVICE AND METHOD FOR ADJUSTING THE OPTICAL AXIS

BACKGROUND OF THE INVENTION

The present invention relates to a charged-particle beam emitting device using a charged-particle beam such as an electron beam or ion beam. More particularly, it relates to a charged-particle beam emitting device and its optical-axis adjusting method which are preferable for acquiring a high-resolution image by suppressing a degradation in the image resolution even when the charged-particle beam is tilted on a sample.

In a charged-particle beam emitting device the representative of which is a scanning electron microscope, a narrowly converged charged-particle beam is scanned on a sample, thereby acquiring desired information (e.g., sample image) from the sample. In the charged-particle beam emitting device like this, implementation of high resolution has been in progress year by year. Simultaneously, in recent years, it has become necessary to tilt the charged-particle beam with respect to the sample so as to acquire tilted image of the sample.

In order to irradiate the sample with the charged-particle beam in the state of being tilted, there exists a method of utilizing the swing-back effect of the charged-particle beam in the off-axis of an objective lens. For example, in JP-U-55-48610 and JP-A-2-33843, the following method has been disclosed: The charged-particle beam is caused to enter the off-axis of the objective lens, thereby utilizing the converging effect (swing-back effect) of the objective lens. Also, in JP-A-2000-348658, the following technology has been disclosed: There is provided a two-stage deflecting unit for deflecting the charged-particle beam in mutually opposite directions within a converging magnetic field of the objective lens. This allows correction of transverse chromatic aberration which occurs when the charged-particle beam is tilted in the off-axis of the objective lens. Also, in JP-A-2001-15055, the following technology has been disclosed: A deflecting unit for causing the charged-particle beam to pass through the off-axis of the objective lens is provided on the electron-source closer side than the objective lens. Then, the chromatic aberration (transverse chromatic aberration) which occurs in the off-axis of the objective lens is corrected using a Wien filter which is provided on the electron-source closer side than the objective lens. This allows a reduction in the image-resolution degradation at the time when the charged-particle beam is tilted. Moreover, in WO 01/33603, the following technology has been disclosed: The Wien filter, which generates orthogonal electrostatic and electromagnetic fields in arbitrary two-dimensional directions orthogonal to the optical axis, is located on the optical axis on the electron-source closer side than the objective lens. This allows correction of the transverse chromatic aberration in an arbitrary direction.

In any one of the above-described conventional technologies, the charged-particle beam is tilted with respect to the sample by utilizing the swing-back effect of the beam in the off-axis of the objective lens. Meanwhile, in order to mutually cancel out aberrations which occur in the off-axes of a plurality of converging lenses including the objective lens, the following operation has been required: Namely, adjustment of an astigmatic corrector and adjustment of the optical axis are repeated, thereby driving the optical axis so that an image acquired turns out to become the sharpest one. This operation, however, requires significant amount of skill and experience. Accordingly, an axis adjusting method or axis adjusting function which is simpler and easier has been desired.

SUMMARY OF THE INVENTION

It is an object of the present invention to provide a charged-particle beam emitting device which allows a high-resolution image to be easily acquired at a high-angle beam tilt by using the axis adjusting method and axis adjusting function which are simple and necessitate no skilled person.

In order to accomplish the above-described object, there is provided a unit for changing control quantities for all of optical components (such as a correction lens) simultaneously and by predetermined quantities. Here, these optical components make contributions to correction of the aberration which occurs when the charged-particle beam is tilted in the off-axis of the objective lens.

Other objects, features and advantages of the invention will become apparent from the following description of the embodiments of the invention taken in conjunction with the accompanying drawings.

DESCRIPTION OF THE INVENTION

Figure 2:
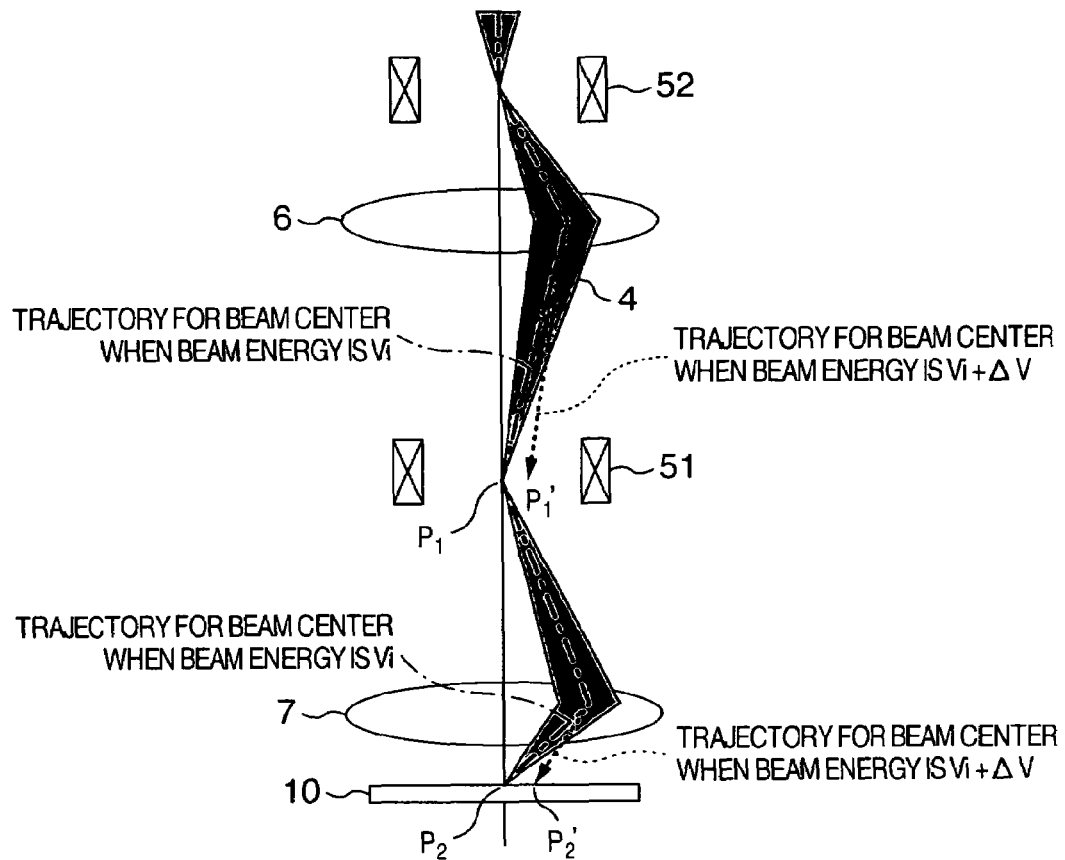
FIG. 2 is the ray diagram for illustrating the changes in the trajectory for beam center at the time when the beam energy changes.

Referring to FIG. 2, the explanation will be given below concerning the principle based on which the optical-axis adjustment becomes easier in this unit.

FIG. 2 is an explanatory diagram for explaining a method for implementing the beam tilt accompanied by the suppressed image-resolution degradation. This beam tilt is implemented such that an aberration which is oppositely directed to the aberration which occurs in the off-axis of the objective lens 7 is generated in the off-axis of a condenser lens 6. Implementing a high-resolution beam condition makes it necessary to simultaneously correct coma abeeration and the transverse chromatic aberration which occur in the off-axis of the objective lens 7. The optical-axis adjustment at this time corresponds to an operation of finding out the condition under which the coma abeeration and the transverse chromatic aberration become equal to 0 as a combined effect of the objective lens 7 and the condenser lens 6. Also, the condition under which, when the transverse chromatic aberration becomes equal to 0, the coma abeeration is also made equal to 0 simultaneously therewith can be implemented as follows: Namely, the excitation current of the condenser lens 6 is set so that the convergence point of the condenser lens 6 determined in advance by calculation becomes an optimum point. In an example in FIG. 2, deflectors 51 and 52 are located at an object point and an image point (convergence point) of the condenser lens 6 so as to deflect the beam, thereby causing the primary charged-particle beam 4 to pass through the off-axes of the respective lenses.

The condition that the transverse chromatic aberration is equal to 0 means that the position of a trajectory for beam center on the sample does not change depending on a difference in the energy. In FIG. 2, a trajectory for beam center for which energy of the primary charged-particle beam is equal to Vi attains to a position $P_1$, which is the convergence point of the condenser lens 6. However, a trajectory for beam center for which the beam energy is equal to Vi+$\Delta$V is displaced to a position $P_1'$. This is because the charged particles have passed through the off-axis of the condenser lens 6. Then, this displacement quantity $(P_1-P_1')$ is downsized by an optical magnification M of the objective lens 7, thereby becoming equal to a position change: M×$(P_1-P_1')$ on the sample 10. Moreover, basically the same phenomenon also occurs in the objective lens 7, and thus the beam-energy change of $\Delta$V causes the trajectory for beam center to displace from $P_2$ to $P_2'$. Accordingly, a condition of the optical axis satisfying $$M \times (P_1-P_1')+(P_2-P_2)=0 \qquad (1)$$

turns out to become the condition under which the transverse chromatic aberrations will be cancelled with each other (i.e., aberration correcting condition).

As the operation of finding out the condition in the expression (1), in substitution for changing the energy of the beam, changing the excitation current of the objective lens 7 is also preferable. Letting the excitation current of the objective lens 7 be Iobj, winding number of a excitation coil be Nobj, and the acceleration voltage (the beam energy) be Vi, the lens effect (strength of the lens: Ex) on the primary charged-particle beam is represented by $$Ex=(Iobj \times Nobj)/\sqrt{Vi}. \qquad (2)$$

Now, assuming that the beam energy has been changed from Vi to Vi+$\Delta$V, the lens strength (Ex) will change as follows:

$$Ex \to Ex+\Delta Ex. \qquad (3)$$

Here, from the relation in the expression (2), $\Delta Ex$ is represented by the following expression:

$$\Delta Ex=-0.5 \times Ex \times (\Delta V/Vi). \qquad (4)$$

As an operation of creating the same change $\Delta Ex$ as the one in the expression (4) by changing the excitation current from Iobj to Iobj+$\Delta$Iobj, it is preferable to set the change quantity $\Delta$Iobj in the excitation current as being $$\Delta Iobj=-0.5 \times Iobj \times (\Delta V/Vi). \qquad (5)$$

Similarly, when letting the excitation current of the condenser lens 6 be Ic, setting of $$\Delta Ic=-0.5 \times Ic \times (\Delta V/Vi) \qquad (6)$$

makes it possible to create, in the condenser lens 6, the same excitation change as the one created when the beam energy has been changed from Vi to Vi+$\Delta$V.

Accordingly, assume that the excitation currents Iobj and Ic are simultaneously changed by the values ($\Delta$Iobj, $\Delta$Ic) indicated by the expression (5) and the expression (6). This makes it possible to create the same state as the one created when the beam energy has been changed by the quantity $\Delta$V. This fact shows the following findings: Namely, changing Iobj and Ic at the change rates ($\Delta$I/I) determined by the energy of the beam passing through the respective lenses is equivalent to changing the beam energy. When applying an acceleration electric-field or deceleration electric-field to the objective-lens portion, there occurs a change in the average energy (Vi) of the charged particles passing through the objective-lens portion. As a result, the current change rate in the objective lens and the current change rate in the condenser lens become different values from each other. In whatever case, the lens currents Iobj and Ic are simultaneously changed by the quantities $\Delta$Iobj and $\Delta$Ic at the current change rates determined in correspondence with the beam energy passing through the respective lenses. Then, the optical axis is adjusted so that a change in the beam position at this time (i.e., displacement of the field-of-view) will become its minimum. This operation allows implementation of the condition under which the transverse chromatic aberrations will be cancelled with each other as the combined effect of the objective lens 7 and the condenser lens 6 (i.e., aberration correcting condition). This operation turns out to become an exceedingly easier adjustment as compared with the adjustments in the conventional technologies. This is because this operation is the adjustment of minimizing the displacement of the image, and because, in the conventional technologies, changes in the picture quality and image resolution are directly judged which are dependent on human's sensory capabilities and qualities.

Letting aligner control value (complex-number representation, j: imaginary-number unit) for the optical-axis adjustment be $W_{AL}=X_{AL}+j \cdot Y_{AL}$, the relation between the aligner control value ($W_{AL}$) and the field-of-view's displacement ($\Delta$W) at the time of changing the lens currents is represented by the following expression: Here, control values $X_{AL}$ and $Y_{AL}$ mean current values caused to flow through the aligner, and more practically, mean numerical values set to a DAC (Digital-to-Analogue Converter) for setting the current values.

$$\Delta W=A \times (C+D \times W_{AL}) \qquad (7)$$

Figure 3:
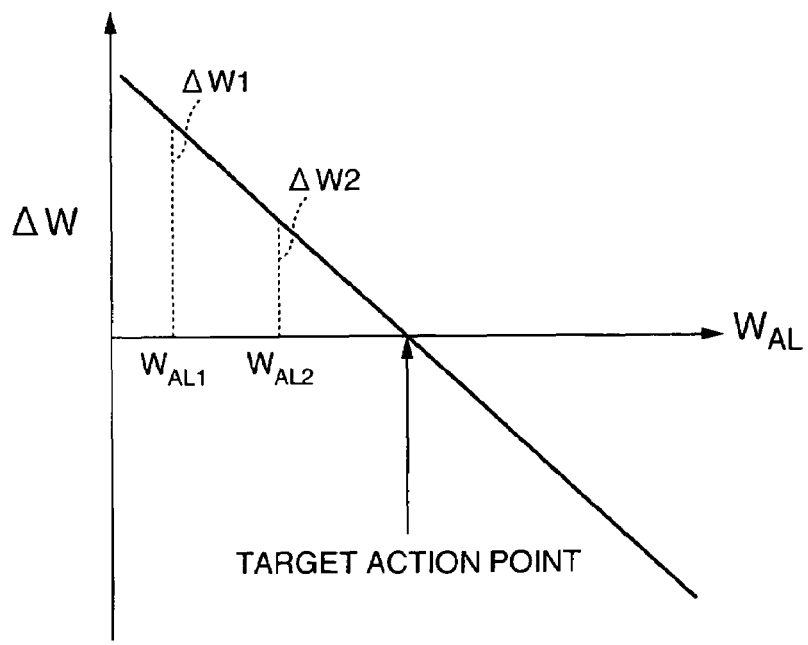
FIG. 3 is the diagram for illustrating the relation between the aligner action point and the field-of-view shift quantity.

Here, A denotes a coefficient determined by the change quantities in the excitation currents, C denotes an initial axis-shift quantity, and D denotes a coefficient dependent on action condition of the electron-optics system and position of the aligner. Excluding A, both C and D are given by complex numbers. FIG. 3 is a diagram where the relation between $\Delta$W and $W_{AL}$ represented by the expression (7) is illustrated using its one-dimensional model for simplicity (Actually, the relation becomes a two-dimensional model where the respective axes have X component and Y component). In FIG. 3, the aligner action point at which the field-of-view's displacement ($\Delta$W) at the time of changing the lens currents becomes equal to 0 is a target action point, which is shown by the arrow in FIG. 3. For example, let the aligner set value ($W_{AL}$) at present be $W_{AL1}$, and let the field-of-view shift quantity ($\Delta W$) at this time be $\Delta W1$. Next, assume that the aligner control value ($W_{AL}$) is set at $W_{AL2}$ which results from shifting $W_{AL1}$ by a predetermined quantity. Also, let the field-of-view shift quantity ($\Delta W$) at this time be $\Delta W2$. These values determine inclination (which corresponds to action sensitivity of the aligner) of the graph in FIG. 3, thereby determining the graph. This allows determination of the target action point at which the field-of-view shift quantity becomes equal to 0. Incidentally, the field-of-view shift quantity turns out to become a shift quantity between two pieces of images where the lens currents differ from each other. Accordingly, the field-of-view shift quantity can be easily detected using an image processing technique such as image correlation. Namely, the field-of-view's displacement ($\Delta W$) for the plurality of aligner set values $W_{AL}$ is detected using the image processing technique. This makes it possible to calculate, from the relation in the expression (7), the aligner control condition $W_{AL}=-C/D$ under which the field-of-view shift quantity $\Delta W=0$ is implemented.

According to the present invention, it becomes possible to easily make the axis adjustment in the case where the beam tilt is implemented by utilizing the converging effect of the objective lens. In addition thereto, it also becomes possible to implement the high-accuracy automatization of the axis adjusting operation.

Hereinafter, the explanation will be given below concerning embodiments of the present invention.

Figure 1:
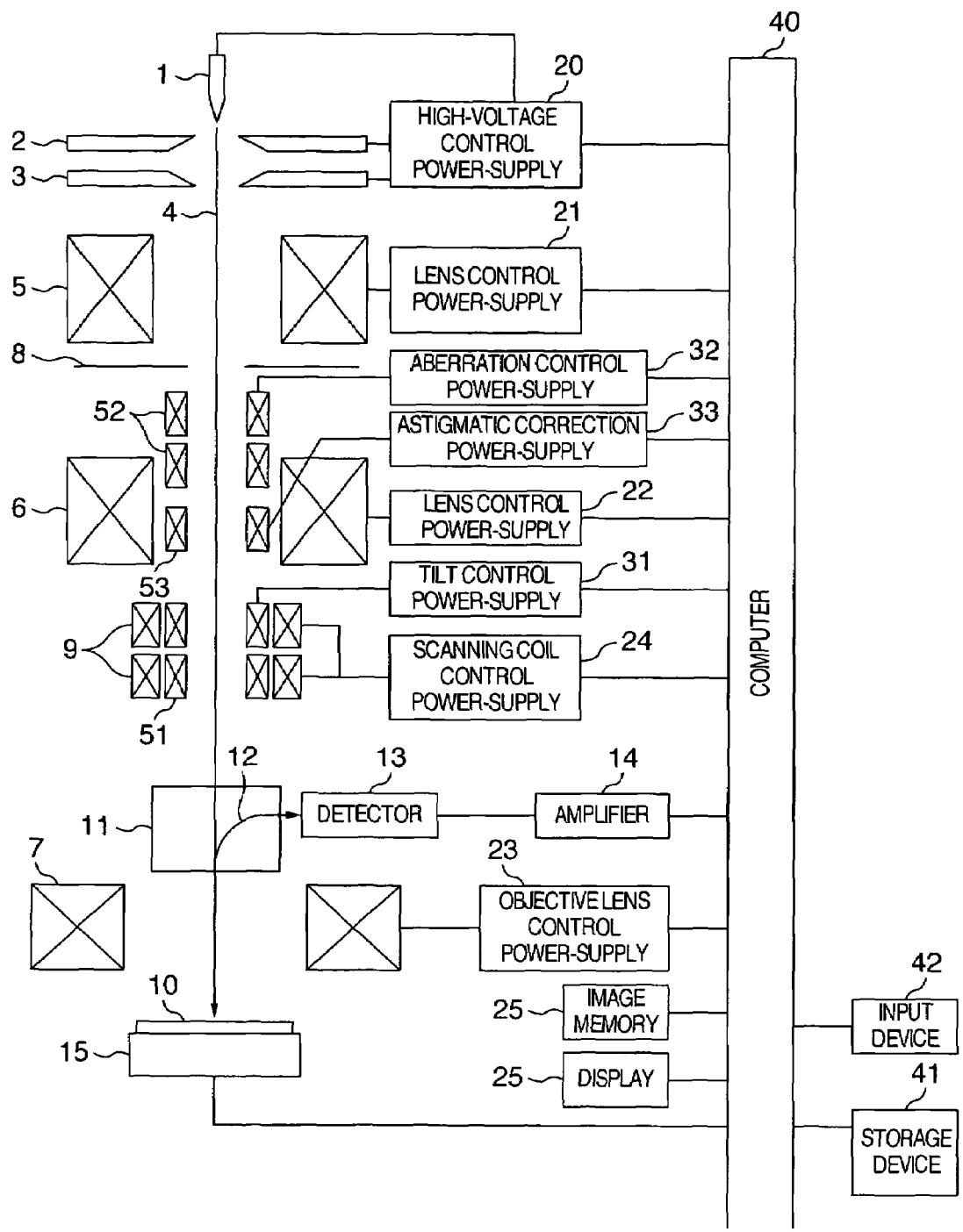
FIG. 1 is a schematic configuration diagram of a scanning electron microscope which is an embodiment of the present invention.

FIG. 1 is a schematic configuration diagram of a scanning electron microscope which is an embodiment of the present invention. Between a cathode 1 and a first anode 2, a voltage is applied by a high-voltage control power-supply 20 controlled by a computer 40. This voltage allows a primary electron beam 4 to be extracted from the cathode 1 by a predetermined emission current. Between the cathode 1 and a second anode 3, an acceleration voltage is applied by the high-voltage control power-supply 20 controlled by the computer 40. This acceleration voltage allows the primary electron beam 4 emitted from the cathode 1 to be accelerated to travel toward a lens system at the backward stage. Then, the primary electron beam 4 is converged by a converging lens 5 controlled by a lens control power-supply 21. Moreover, after unnecessary area of the primary electron beam 4 has been removed by a diaphragm plate 8, the primary electron beam 4 is converged onto a sample 10 as a micro spot by a converging lens 6 controlled by a lens control power-supply 22 and an objective lens 7 controlled by an objective-lens control power-supply 23. The objective lens 7 can employ various modes such as the in-lens scheme, the out-lens scheme, and the snorkel scheme (semi in-lens scheme). Also, the objective lens can employ the retarding scheme whereby a negative voltage is applied to the sample thereby to decelerate the primary electron beam at the sample. Furthermore, the respective lenses may also be configured by electrostatic-type lenses including a plurality of electrodes.

The primary electron beam 4 is scanned on the sample 10 in a two-dimensional manner by a scanning coil 9 which is controlled by a scanning-coil control power-supply 24. At this time, by the irradiation with the primary electron beam 4, a secondary signal 12, such as secondary electrons, is generated from the sample 10. Then, after traveling onto the upper portion of the objective lens 7, the secondary signal 12 is separated from the primary electrons by a device 11 which produces orthogonal-electrostatic-and-electromagnetic-fields for separating the secondary signal 12. The secondary signal 12 separated is detected by a secondary-signal detector 13. Moreover, the secondary signal 12 detected by the secondary-signal detector 13, after being amplified by a signal amplifier 14, is transferred to an image memory 25. Furthermore, the secondary signal 12 is displayed as a sample image by an image display device 26.

A two-stage deflecting coil 51 is located at the same position as that of the scanning coil 9. The deflecting coil 51 allows position of the primary electron beam 4 entering the objective lens 7 to be controlled in a two-dimensional manner by a tilt control power-supply 31 so that object point of the objective lens 7 becomes the deflection fulcrum. An astigmatism correction coil 53, which is located in the vicinity of the converging lens 6, is controlled in conjunction with beam tilt conditions by an astigmatic correction power-supply 33. A two-stage deflecting coil 52 is located between the converging lens 6 and the diaphragm plate 8. The deflecting coil 52 allows position of the primary electron beam 4 entering the converging lens 6 to be controlled in a two-dimensional manner by an aberration control power-supply 32 so that object point of the converging lens 6 becomes the deflection fulcrum. In addition to a primary-electron-beam position control signal for permitting the object point of the objective lens 7 to become the deflection fulcrum, a control signal for permitting the irradiation position with the primary electron beam on the sample to be controlled in a two-dimensional manner can also be caused to flow along the deflecting coil 51. This control signal makes it possible to correct shift in the irradiation position in conjunction with the beam tilt conditions. The deflecting coil 51 also carries out the function as the above-described aligner.

A sample stage 15 is capable of displacing the sample 10 in at least two directions (X direction and Y direction) within a plane perpendicular to the primary electron beam. An input device 42 makes it possible to specify image fetching conditions (such as scanning velocity and acceleration voltage), the beam tilt conditions (such as tilt direction and tilt angle), output of images, saving of the images into a storage device 41, and the like.

Embodiment 1

Concerning an embodiment for correcting the transverse chromatic aberration which occurs at the time of the beam tilt by the scanning electron microscope having the configuration illustrated in FIG. 1, the detailed explanation will be given below, referring to FIG. 4 where its main portion is excerpted.

In correspondence with the set condition for the beam tilt angle, the deflecting coil 52 deflects the primary beam 4 so that the object point of the converging lens 6 becomes the deflection fulcrum, thereby causing the primary beam 4 to enter the off-axis of the converging lens 6. Next, the primary beam 4, which has entered the off-axis of the converging lens 6, is swung back by the lens effect of the converging lens 6, thereby attaining to a point $P_1$. At the convergence point of the converging lens 6, the deflecting coil 51 is located. The deflecting coil 51 causes the primary beam 4 to enter the off-axis of the objective lens 7. Next, the primary beam 4, which has entered the off-axis of the objective lens 7, is swung back by the lens effect of the objective lens 7, thereby entering the upper surface of the sample 10 in a state of being tilted. The control quantities for the deflecting coils 51 and 52 are set in correspondence with the beam tilt angle and in accordance with a predetermined relationship therebetween. Ideally, the traverse aberrations (i.e., chromatic aberration and coma aberration) of the objective lens 7 are cancelled out by the off-axis aberrations of the converging lens 6. Under actual circumstances, however, the canceling between the off-axis aberrations of the objective lens 7 and the off-axis aberrations of the converging lens 6 cannot completely be achieved because of factors such as slight amount of axis shift and control error. Accordingly, in the present embodiment, the processing proceeds to the next axis-adjusting stage.

At the axis adjusting stage, same-phase and simultaneous variations (i.e., periodic changes in time) whose amplitudes are $\Delta Ic$ and $\Delta Iobj$ respectively are provided to current of the converging lens 6 and current of the objective lens 7. Incidentally, the amplitudes $\Delta Ic$ and $\Delta Iobj$ are controlled such that the following expression will be satisfied:

$$(\Delta Ic/Ic)=(\Delta Iobj/Iobj) \quad (8)$$

If field-of-view of the SEM image is displaced in synchronization with the variations in these lens currents, it means that the correcting condition for correcting the off-axis aberrations has become irrelevant. Consequently, the deflecting coil 51 is adjusted so that the field-of-view displacement of the SEM image will become its minimum, thereby adjusting the primary-beam incidence position into the objective lens 7. When the field-of-view displacement has become its minimum in this operation, the off-axis aberrations of the converging lens 6 and the off-axis aberrations of the objective lens 7 are cancelled with each other. This permits a high-resolution SEM image to be acquired in the state where the beam is tilted with respect to the sample. Incidentally, like the case where a voltage is applied to the sample, if the primary beam passing through the objective-lens area and the primary beam passing through the converging-lens area differ from each other in their energies, $$(\Delta Ic/Ic)=k\cdot(\Delta Iobj/Iobj) \quad (9)$$

is employed in substitution for the expression (8). Here, k denotes a coefficient dependent on the difference between the beam energies in the objective-lens area and the converging-lens area. The coefficient k can be determined in advance by calculation or experiment.

Embodiment 2

In the present embodiment, referring to FIG. 4 and FIG. 5, the detailed explanation will be given below concerning an embodiment for automatically adjusting an optical-axis condition for correcting the transverse chromatic aberration which occurs at the time of the beam tilt by the scanning electron microscope having the configuration illustrated in FIG. 1.

Figure 4:
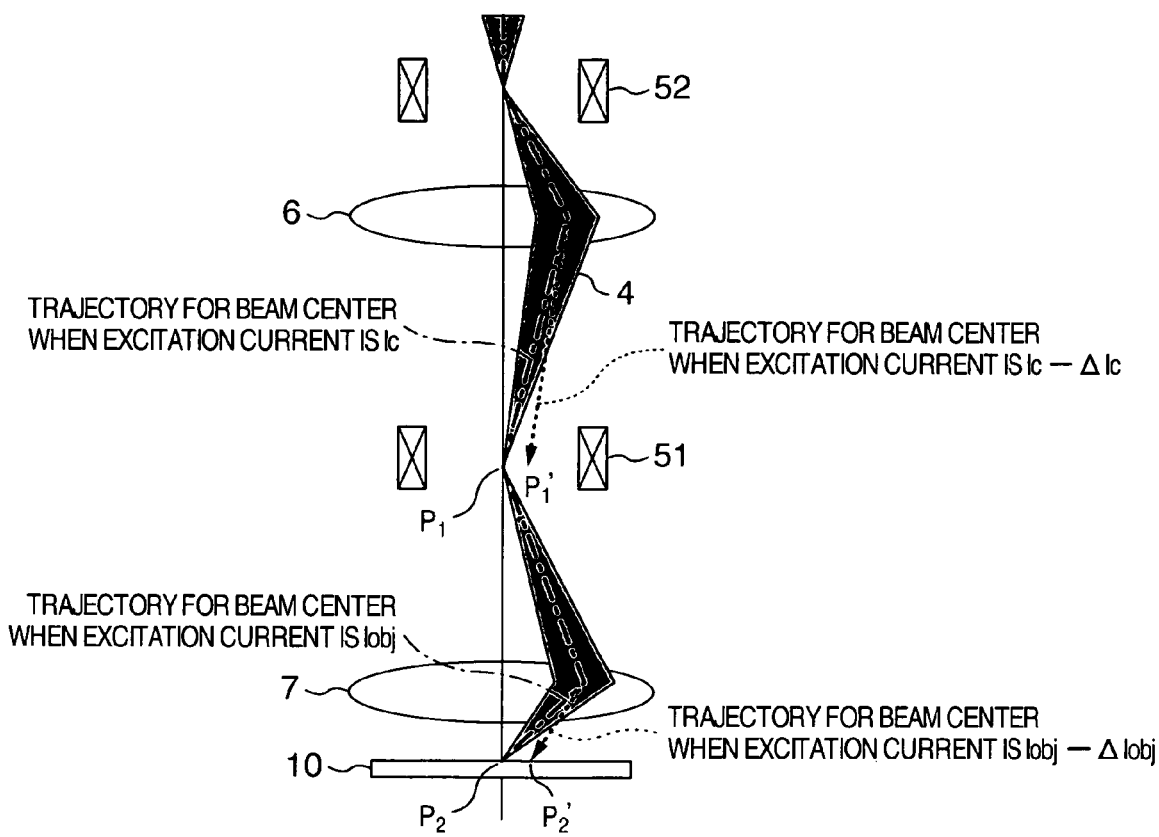
FIG. 4 is an ray diagram for illustrating changes in the trajectory for beam center at the time when the excitation currents of the lenses change.
Figure 5:
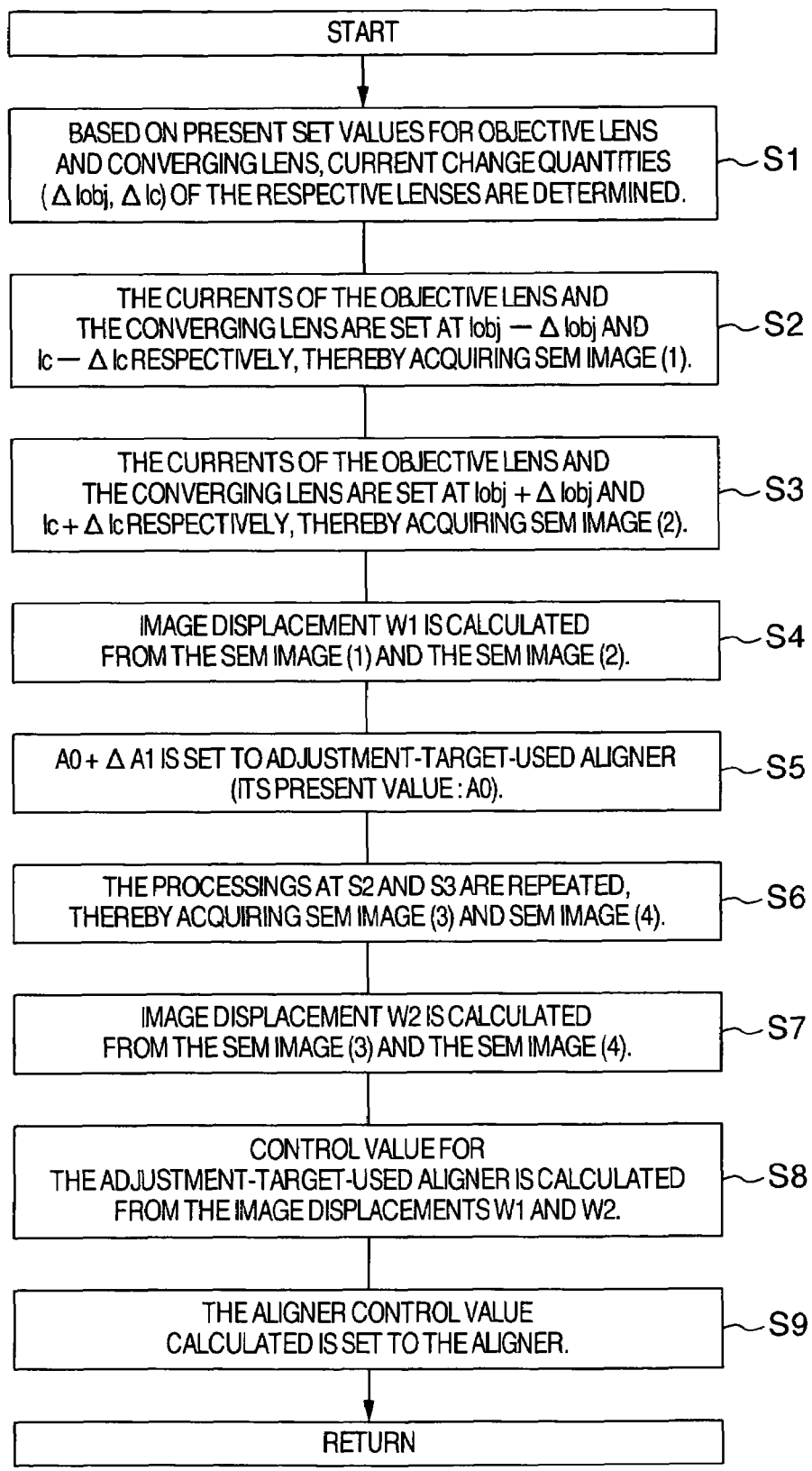
FIG. 5 is a processing flow for automatically detecting an optical axis on which the transverse chromatic aberration will be corrected.

In correspondence with the beam tilt angle relative to the sample, the control conditions for the deflecting coils 52 and 51 illustrated in FIG. 4 are set in accordance with the predetermined relationship therebetween. After that, in order to amend the optical-axis shift thereby to create the optical-axis condition under which the off-axis aberrations of the converging lens 6 and the off-axis aberrations of the objective lens 7 will be cancelled with each other, processing steps S1 to S9 in FIG. 5 are executed.

(i) S1

In this processing, based on the expression (9), the current change quantities ($\Delta Ic$, $\Delta Iobj$) of the converging lens 6 and the objective lens 7 are calculated.

(ii) S2 to S4

From two pieces of images acquired by changing the lens currents, field-of-view shift quantity (W1) is detected.

(iii) S5

A change quantity $\Delta A1$ determined in advance is added to the aligner (i.e., the deflecting coil 51), thereby changing the aligner control value.

(iv) S6 to S7

The processings at S2 to S4 are repeated, thereby detecting field-of-view shift quantity (W2) between two pieces of images with respect to the aligner whose control value has been changed.

(v) S8

Optimum control value for the aligner is calculated from the field-of-view shift quantities W1 and W2. This calculation can be performed based on the expression (7). Namely, from the field-of-view shift quantity W1 at the time of $W_{AL}=A0$, the following relation:

$$W1=A\times(C+D\times A0) \quad (10)$$

can be acquired. Next, from the field-of-view shift quantity W2 at the time of $W_{AL}=A0+\Delta A1$, the following relation:

$$W2=A\times(C+D\times(A0\Delta A1)) \quad (11)$$

can be acquired.

From the expressions (10) and (11), the unknown quantities C and D can be solved as follows:

$$C=(1/A)\cdot[W1-(A0/\Delta A1)(W2-W1)] \quad (12)$$

$$D=(1/A)\cdot(W2-W1)/\Delta A1. \quad (13)$$

The optimum control value for the aligner, which is the condition under which $\Delta W=0$ is implemented in the expression (7), is acquired by $$W_{AL}=-C/D. \quad (14)$$

Accordingly, the optimum control value for the aligner (i.e., the correcting condition for correcting the off-axis aberrations) can be acquired from the expressions (12) and (13) as $$W_{AL}=-[W1-(A0/\Delta A1)(W2-W1)]/[(W2-W1)/\Delta A1] \quad (15).$$

Consequently, even if the unknown quantity A is contained in the expressions (12) and (13), the optimum control value for the aligner can be calculated.

(vi) S9

The aligner control value $W_{AL}$ calculated by the expression (15) is set to the aligner.

Embodiment 3

Figure 6:
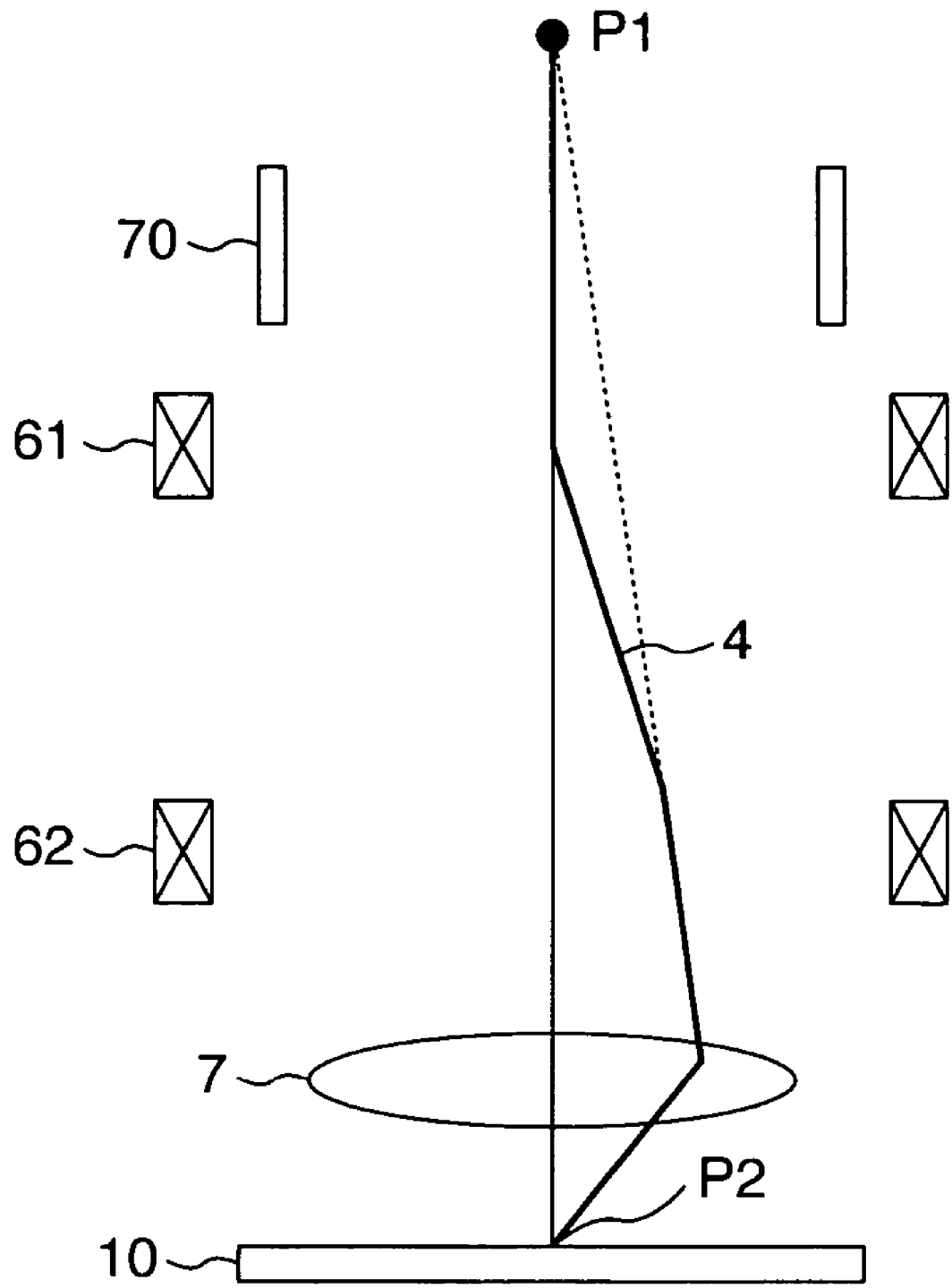
FIG. 6 is a diagram for illustrating a layout example of optical-system configuration components and the beam trajectory in the case where the transverse chromatic aberration which has occurred in the off-axis of the objective lens will be corrected by using a Wien filter.

FIG. 6 illustrates an embodiment of the present invention in an optical-axis adjusting method at the time when the primary beam 4 is tilted on the sample 10 after the transverse chromatic aberration which occurs in the off-axis of the objective lens 7 has been corrected by using a Wien filter 70. In the embodiment in FIG. 6, deflecting coils 61 and 62 are operated so that the object point (beam crossover point) with reference to the objective lens 7 becomes the seeming deflection fulcrum, thereby causing the primary beam 4 to enter the off-axis of the objective lens 7. At this time, the primary beam 4 is swung back in the off-axis of the objective lens 7, thereby attaining to the original point $P_2$ on the sample. The chromatic aberration, however, occurs in the off-axis of the objective lens 7 simultaneously. The Wien filter 70, which is located above the objective lens 7, is operated so that the chromatic aberration which has occurred in the off-axis of the objective lens 7 will be just corrected. In the present embodiment, in order to adjust the operating condition for correcting the chromatic aberration, the excitation current of the objective lens 7 and current or voltage of the Wien filter 70 are simultaneously varied by quantities determined in advance. At this time, excluding the operating condition for correcting the chromatic aberration, displacement of the image occurs in correspondence with the variations in the parameters. Then, the deflection quantity of the deflecting coils 61 and 62, or operating condition for the Wien filter 70 is adjusted so that this displacement of the image will become its minimum. Hereinafter, the explanation will be given below concerning the principle based on which the chromatic aberration which occurs in the off-axis of the objective lens 7 will be corrected by the present embodiment.

In the Wien filter 70, an electric field and a magnetic field are generated which are orthogonal to each other. Moreover, magnitudes of these electric and magnetic fields are set as follows: Namely, these fields exert deflecting effects in opposite directions on the electrons which have energy Vi and are passing through these fields, so that these deflecting effects will be cancelled with each other. The magnitudes of these electric and magnetic fields satisfying this condition can be easily set by making an adjustment for allowing one and the same field-of-view to be acquired before and after the operation of the Wien filter 70. At this time, letting the field-of-view shift quantities caused to occur by the electric field and the magnetic field be $r_E$ and $r_B$, respectively, the Wien condition for preventing the primary beam 4 from being deflected is represented by the following expression:

$$r_E = r_B. \quad (16)$$

Meanwhile, the deflection quantities ($r_E$, $r_B$) caused to occur by the electric field and the magnetic field are represented by the following expressions, letting the acceleration voltage be Vi, voltage for inducing the electric field be $V_E$, and excitation current for inducing the magnetic field be $I_B$:

$$r_E = K_E \cdot V_E/Vi \quad (17)$$

$$r_B = K_B \cdot IB/Vi^{1/2}. \quad (18)$$

Here, $K_E$ and $K_B$ denote coefficients dependent on factors such as configuration of electrodes and the coils and layout of the Wien filter. In this way, in the electron beam which has passed through the Wien filter, the electrons having the average energy (Vi) are not deflected by the difference in the dependence of the deflection quantities ($r_E$, $r_B$) upon the acceleration voltage Vi. A variation $\Delta V$ in the energy, however, causes an energy dispersion (i.e., chromatic aberration) $\Delta r_c$ to occur on the sample. This energy dispersion is represented by the following expression:

$$\Delta r_c = 0.5 \times r_B \times (\Delta V/Vi) = 0.5 \times r_E \times (\Delta V/Vi). \quad (19)$$

In order to detect magnitude of the energy dispersion $\Delta r_c$ as the displacement of the image, a change $\Delta I_B$ in the excitation current $I_B$ is determined which is equivalent to changing the average energy of the beam from Vi to Vi+$\Delta V$. As a result of this, the following expression is acquired from basically the same idea as the one in the case of the converging lens:

$$\Delta I_B = -0.5 \times I_B \times (\Delta V/Vi). \quad (20)$$

Namely, when $\Delta$Iobj calculated by the expression (5) and the change $\Delta I_B$ in the excitation current $I_B$ of the Wien filter calculated by the expression (20) have been simultaneously provided, if there occurs none of the displacement of the image, it means that the chromatic aberration has been corrected. Meanwhile, changing the voltage $V_E$ of the Wien filter also makes it possible to implement the same effect. A voltage change $\Delta V_E$ which is equivalent to the change $\Delta V$ in the beam energy becomes equal to $$\Delta V_E = -V_E \times (\Delta V/Vi). \quad (21)$$

Figure 7:
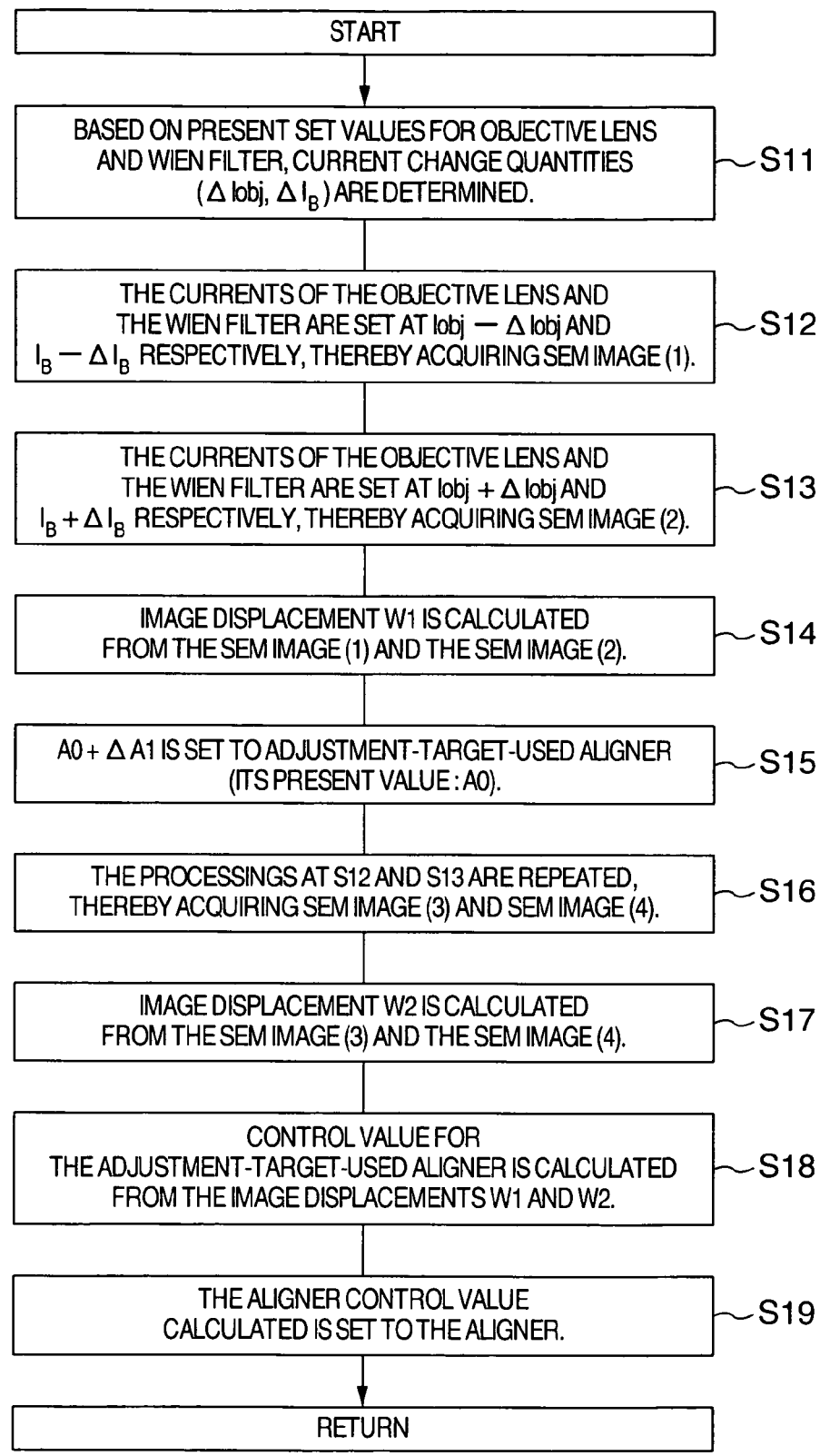
FIG. 7 is a processing flow for automatically detecting an optical axis on which the transverse chromatic aberration will be corrected when correcting the transverse chromatic aberration by using the Wien filter.

Accordingly, the excitation current Iobj of the objective lens and the operating condition (the current or voltage) on the Wien filter are simultaneously changed. This makes it possible to determine the magnitude of the Wien filter 70 or the condition for the deflecting coils 61 and 62 so that the displacement of the field-of-view will become its minimum. Also, executing processing steps S11 to S19 in FIG. 7 also makes it possible to automatically calculate the chromatic-aberration correcting condition.

(i) S11

In this processing, based on the expression (20), the current change quantities ($\Delta$Iobj, $\Delta I_B$) of the objective lens and the Wien filter are calculated.

(ii) S12 to S14

From two pieces of images acquired by simultaneously changing the objective-lens current and the Wien-filter current, field-of-view shift quantity (W1) is detected.

(iii) S15

A change quantity $\Delta$A1 determined in advance is added to the aligner, thereby changing the aligner control value.

(iv) S16 to S17

The processings at S12 to S14 are repeated, thereby detecting field-of-view shift quantity (W2) between two pieces of images with respect to the aligner whose control value has been changed.

(v) S18

Optimum control value for the aligner is calculated from the field-of-view shift quantities W1 and W2. This calculation can be performed based on the expression (7). Namely, from the field-of-view shift quantity W1 at the time of $W_{AL}$=A0 , the following relation:

$$W1 A \times (C + D \times A0) \quad (22)$$

can be acquired. Next, from the field-of-view shift quantity W2 at the time of $W_{AL}$=A0+$\Delta$A1, the following relation:

$$W2 = A \times (C + D \times (A0 + \Delta A1)) \quad (23)$$

can be acquired. From the expressions (22) and (23), the unknown quantities C and D can be solved as follows:

$$C = (1/A) \cdot [W1 - (A0/\Delta A1)(W2 - W1)] \quad (24)$$

$$D = (1/A) \cdot (W2 - W1)/\Delta A1. \quad (25)$$

The optimum control value for the aligner, which is the condition under which $\Delta W$=0 is implemented in the expression (7), is acquired by $$W_{AL} = -C/D. \quad (26)$$

Accordingly, the optimum control value for the aligner (i.e., the correcting condition for correcting the off-axis aberrations) can be acquired from the expressions (24) and (25) as $$W_{AL} = -[W1 - (A0/\Delta A1)(W2 - W1)]/[(W2 - W1)/\Delta A1]. \quad (27)$$

Consequently, even if the unknown quantity A is contained in the expressions (24) and (25), the optimum control value for the aligner can be calculated.

(vi) S19

The aligner control value $W_{AL}$ calculated by the expression (27) is set to the aligner.

Incidentally, at S11, the same result can be acquired using $\Delta V_E$ in the expression (21) instead of using the current change quantity $\Delta I_B$ of the Wien filter.

Embodiment 4

Figure 8:
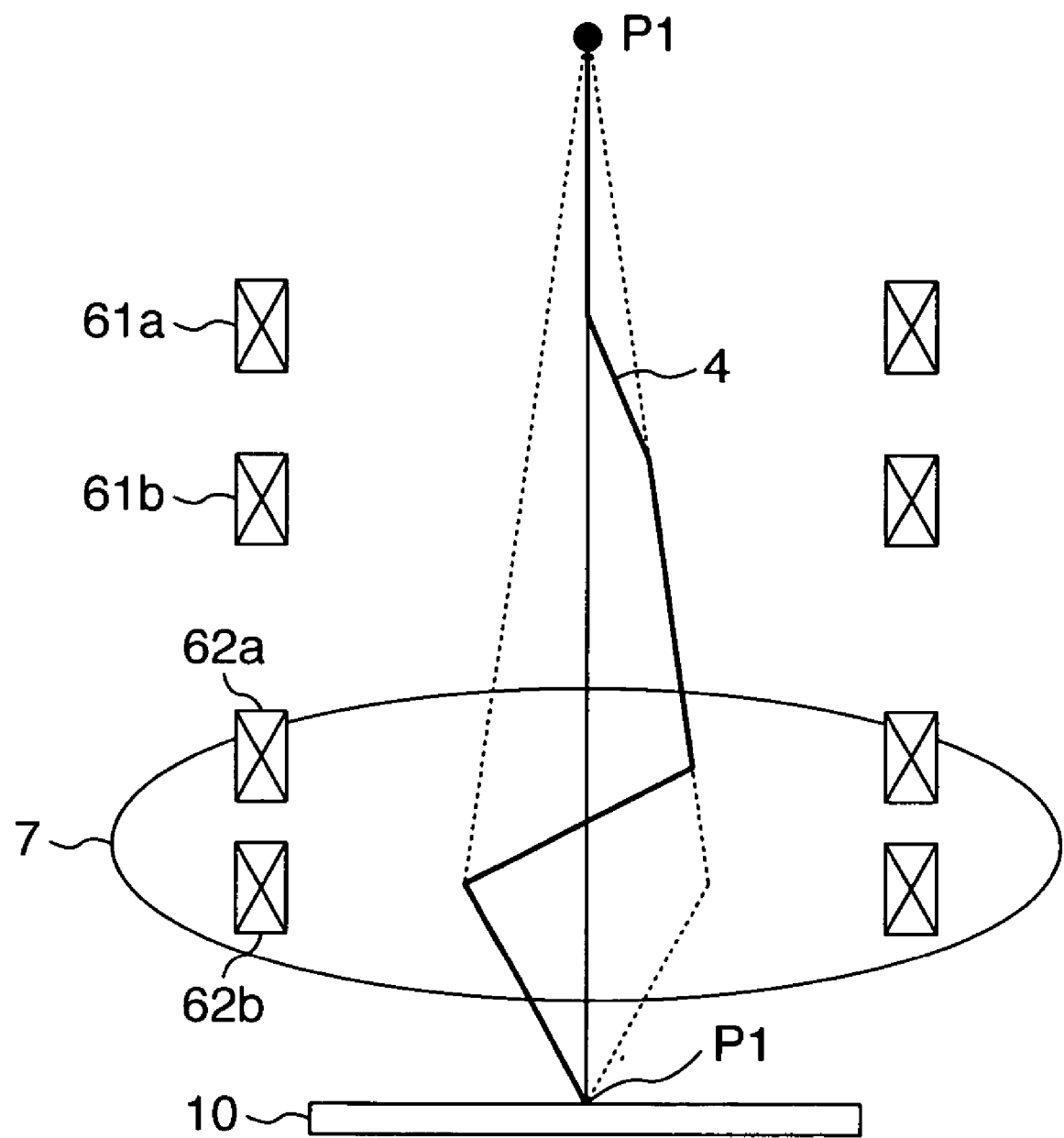
FIG. 8 is a diagram for illustrating the beam trajectory when the primary beam is multi-deflected within the objective lens so as to correct the chromatic aberration which occurs in accompaniment with the beam tilt.

In an embodiment illustrated in FIG. 8, deflecting coils 61a and 61b, which are located above the objective lens 7, causes the primary beam 4 to slide away from the optical axis in such a manner as to travel along its convergence trajectory, then causing the primary beam 4 to enter the objective lens 7. Moreover, deflecting coils 62a and 62b, which are located within magnetic field of the objective lens 7, invert the direction of the orbit, thereby causing the primary beam 4 to enter the sample in such a manner as to be tilted along a convergence orbit existing in a direction shifted by 180°. At this time, slight amount of position shifts in the deflecting coils cause a correction error of the chromatic aberration to occur. In the present embodiment, in order to avoid an image-resolution degradation caused by this correction error of the chromatic aberration, the adjustment is made in accordance with the following steps:

(1) Deflecting current determined in advance in correspondence with the beam tilt angle is set to the deflecting coils 61a, 61b, 62a, and 62b.

(2) Excitation current of the objective lens 7 is changed with amplitude determined in advance, then confirming displacement of the image varying in conjunction with the change in the excitation current.

(3) Current of the deflecting coil 61b is adjusted so that the displacement of the image varying in conjunction with the change in the excitation current of the objective lens 7 will become its minimum.

Figure 9:
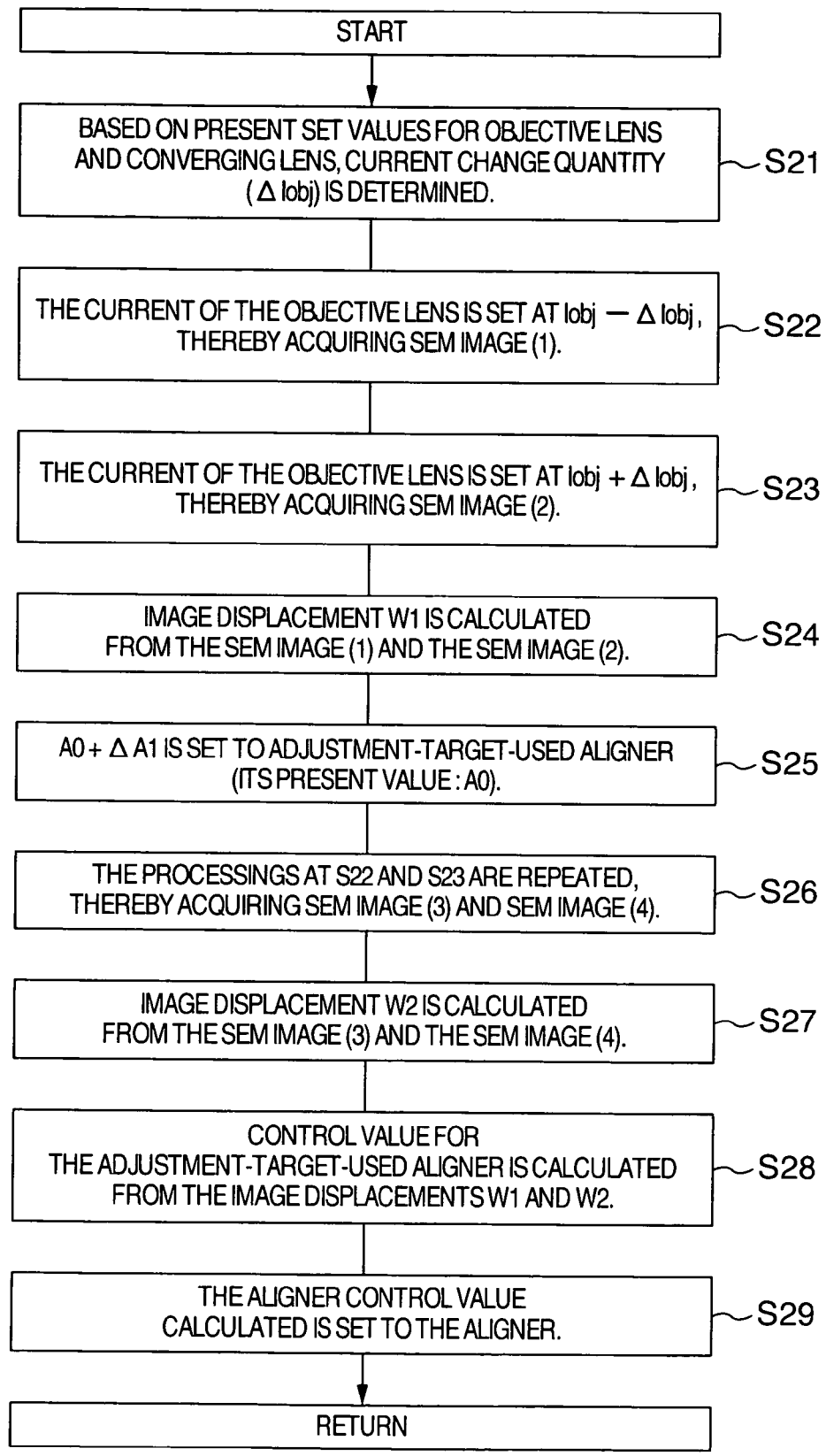
FIG. 9 is a processing flow for automatically detecting an optical axis on which the transverse chromatic aberration will be corrected when correcting the transverse chromatic aberration within one and the same objective lens.

In the case of the present embodiment, the entire chromatic aberration which will occur in accompaniment with the beam tilt occurs within the objective lens 7. As a consequence, an optical-axis condition under which the displacement of the sample image disappears in association with the change in the excitation current of the objective lens 7 turns out to become the condition for preventing the chromatic aberration in accompaniment with the beam tilt from occurring. Incidentally, a coil for creating the optical-axis condition like this is not limited to the deflecting coil 61b. For example, combination of the deflecting coils 61b and 62b, or some combination other than this one also allows implementation of the optical-axis condition like this. In whatever case, the adjusting-operation of minimizing the field-of-view's displacement while watching the field-of-view's displacement allows implementation of the chromatic-aberration correcting condition. This makes it possible to make the adjustment easily. Furthermore, executing processing steps S21 to S29 in FIG. 9 also makes it possible to automatically calculate and set the optical axis for the chromatic-aberration correcting condition.

(i) S21

In this processing, the current change quantity ($\Delta Iobj$) is calculated in correspondence with the set value for the objective-lens current.

(ii) S22 to S24

From images acquired by changing the objective-lens current, field-of-view shift quantity (W1) is detected.

(iii) S25

A change quantity $\Delta A1$ determined in advance is added to the aligner (e.g., the deflecting coil 61b), thereby changing the aligner control value.

(iv) S26 to S27

The processings at S22 to S24 are repeated, thereby detecting field-of-view shift quantity (W2) with respect to the aligner whose control value has been changed.

(v) S28

Optimum control value for the aligner is calculated from the field-of-view shift quantities W1 and W2. This calculation can be performed based on the expression (7). Namely, from the field-of-view shift quantity W1 at the time of $W_{AL}=A0$, the following relation:

$$W1 = A \times (C + D \times A0) \tag{28}$$

can be acquired. Next, from the field-of-view shift quantity W2 at the time of $W_{AL}=A0+\Delta A1$, the following relation:

$$W2 A \times (C + D \times (A0 + \Delta A1)) \tag{29}$$

can be acquired.

From the expressions (28) and (29), the unknown quantities C and D can be solved as follows:

$$C = (1/A) \cdot [W1 - (A0/\Delta A1)(W2 - W1)] \tag{30}$$

$$D = (1/A) \cdot (W2 - W1)/\Delta A1. \tag{31}$$

The optimum control value for the aligner, which is the condition under which $\Delta W=0$ is implemented in the expression (7), is acquired by $$W_{AL} = -C/D. \tag{32}$$

Accordingly, the optimum control value for the aligner (i.e., the correcting condition for correcting the off-axis aberrations) can be acquired from the expressions (30) and (31) as $$W_{AL} = -[W1 - (A0/\Delta A1)(W2 - W1)]/[(W2 - W1)/\Delta A1] \tag{33}$$

Consequently, even if the unknown quantity A is contained in the expressions (30) and (31), the optimum control value for the aligner can be calculated.

(vi) S29

The aligner control value $W_{AL}$ calculated by the expression (33) is set to the aligner.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A charged-particle beam emitting device, comprising:
   a charged-particle source,
   a charged-particle optical system including a plurality of lenses for converging a primary charged-particle beam and scanning said primary charged-particle beam on a sample, said primary charged-particle beam being emitted from said charged-particle source,
   detecting means for detecting signal particles generated from said sample by said scanning of said primary charged-particle beam, optical-axis adjusting means for adjusting optical axis of said primary charged-particle beam, and a control unit for controlling said plurality of lenses, sample image being acquired by using said signal particles detected by said detecting means, wherein said control unit has a control mode of simultaneously varying control values for said plurality of lenses with reference to respective set values therefor and at ratios determined in correspondence with energy of said primary charged-particle beam passing through said respective lenses.

2. The charged-particle beam emitting device according to claim 1, wherein said control unit calculates a set value for said optical-axis adjusting means from a shift quantity between a plurality of sample images acquired in said control mode.

3. The charged-particle beam emitting device according to claim 2, wherein, from a first shift quantity between two pieces of sample images and a second shift quantity between two pieces of sample images, said control unit calculates a control value for said optical-axis adjusting means at which a shift quantity between a plurality of sample images becomes equal to zero, said two pieces of sample images being acquired when setting a first control value to said optical-axis adjusting means, and simultaneously varying said control values for said plurality of lenses with reference to said respective set values therefor and at said ratios determined in correspondence with said energy of said primary charged-particle beam passing through said respective lenses, said two pieces of sample images being acquired when setting a second control value to said optical-axis adjusting means, and simultaneously varying said control values for said plurality of lenses with reference to said respective set values therefor and at said ratios determined in correspondence with said energy of said primary charged-particle beam passing through said respective lenses, said plurality of sample images being acquired when simultaneously varying said control values for said plurality of lenses with reference to said respective set values therefor and at said ratios determined in correspondence with said energy of said primary charged-particle beam passing through said respective lenses.

4. The charged-particle beam emitting device according to claim 1, wherein said primary charged-particle beam is caused to pass through off-axes of said plurality of lenses of said charged-particle optical system thereby to cause said primary charged-particle beam to enter said sample in a state of being tilted thereto.

5. A method for adjusting optical axis of a charged-particle beam emitting device, whereby a primary charged-particle beam emitted from a charged-particle source is caused to pass through a charged-particle optical system thereby being converged and scanned on a sample, and signal particles generated from said sample by said scanning of said primary charged-particle beam are detected thereby to acquire sample image, said charged-particle optical system including a plurality of lenses and optical-axis adjusting means, said method comprising the steps of:

simultaneously varying control values for said plurality of lenses with reference to respective set values therefor and at ratios determined in correspondence with energy of said primary charged-particle beam passing through said respective lenses, and adjusting, by said optical-axis adjusting means, optical axis of said primary charged-particle beam so that a displacement quantity of said sample image which occurs at the time of said simultaneous variation will become its minimum.

6. The method according to claim 5, further comprising the steps of:

acquiring two pieces of sample images by setting a first control value to said optical-axis adjusting means, and simultaneously varying said control values for said plurality of lenses with reference to said respective set values therefor and at said ratios determined in correspondence with said energy of said primary charged-particle beam passing through said respective lenses, determining a first shift quantity between said two pieces of sample images, acquiring two pieces of sample images by setting a second control value to said optical-axis adjusting means, and simultaneously varying said control values for said plurality of lenses with reference to said respective set values therefor and at said ratios determined in correspondence with said energy of said primary charged-particle beam passing through said respective lenses, determining a second shift quantity between said two pieces of sample images, based on said first and second control values for said optical-axis adjusting means, and said first and second shift quantities between said two pieces of sample images each, calculating a control value for said optical-axis adjusting means at which a shift quantity between two pieces of sample images becomes equal to zero, said two pieces of sample images being acquired when simultaneously varying said control values for said plurality of lenses with reference to said respective set values therefor and at said ratios determined in correspondence with said energy of said primary charged-particle beam passing through said respective lenses, and setting said control value calculated to said optical-axis adjusting means.

7. A method for adjusting optical axis of a charged-particle beam emitting device, whereby a primary charged-particle beam emitted from a charged-particle source is caused to pass through a charged-particle optical system thereby to be converged and scanned on a sample, said charged-particle optical system including an objective lens, first deflector located on said charged-particle-source closer side than said objective lens and designed for adjusting optical axis of said primary charged-particle beam, a second deflector and a third deflector for adjusting said optical axis of said primary charged-particle beam within magnetic field of said objective lens, and said primary charged-particle beam is caused to enter said sample in a state of being tilted thereto by said first, second, and third deflectors, and signal particles generated from said sample by said scanning of said primary charged-particle beam are detected thereby to acquire sample image, said method comprising the steps of:

changing excitation current of said objective lens, and determining a control condition for at least one deflector of said first, second, and third deflectors so that a displacement quantity of said sample image which occurs at the time of said excitation-current change will become its minimum.

8. The method according to claim 7, further comprising the steps of:

setting a first control value as control value for at least deflector of said first, second, and third deflector, and changing control value for said objective lens thereby to acquire two pieces of sample images, determining a first shift quantity between said two pieces of sample images, modifying said first control value to a second control value, and changing said control value for said objective lens thereby to acquire two pieces of sample images, determining a second shift quantity between said two pieces of sample images, based on said first and second control values, and said first and second shift quantities between said two pieces of sample images each, calculating said control value for at least one said deflector of said first, second, and third deflectors at which a shift quantity between said two pieces of sample images acquired by changing said control value for said objective lens becomes equal to zero, and setting said control value calculated to at least said one optical-axis adjusting means of said first, second, and third optical-axis adjusting means.

* * * * *